(12) United States Patent
Heitzig et al.

(10) Patent No.: US 8,774,490 B2
(45) Date of Patent: Jul. 8, 2014

(54) METHOD FOR THE LINEAR STRUCTURING OF A COATED SUBSTRATE FOR THE PRODUCTION OF THIN-FILM SOLAR CELL MODULES

(75) Inventors: Joerg Heitzig, Jena (DE); Sebastian Steinbach, Jena (DE); Frank Seidel, Stadtroda (DE)

(73) Assignee: JENOPTIK Automatisierungstechnik GmbH, Jena (DE)

( * ) Notice: Subject to any disclaimer, the term of this patent is extended or adjusted under 35 U.S.C. 154(b) by 0 days.

(21) Appl. No.: 13/564,373

(22) Filed: Aug. 1, 2012

(65) Prior Publication Data
US 2013/0034294 A1  Feb. 7, 2013

(30) Foreign Application Priority Data
Aug. 5, 2011 (DE) .......................... 10 2011 052 444

(51) Int. Cl.
*G06K 9/00* (2006.01)

(52) U.S. Cl.
USPC .............................. 382/141; 438/65; 700/121

(58) Field of Classification Search
CPC .................................................. H01L 27/1425
USPC ........................... 382/141; 700/103, 121, 123
See application file for complete search history.

(56) References Cited

U.S. PATENT DOCUMENTS

| | | | | |
|---|---|---|---|---|
| 7,019,207 | B2 * | 3/2006 | Harneit et al. | 136/244 |
| 8,554,353 | B2 * | 10/2013 | Jeong et al. | 700/121 |
| 8,569,094 | B2 * | 10/2013 | Stolt et al. | 438/64 |
| 2008/0105295 | A1 | 5/2008 | Manz | |
| 2009/0324903 | A1 | 12/2009 | Rumsby | |
| 2010/0314367 | A1 | 12/2010 | Shamoun et al. | |
| 2011/0111576 | A1 * | 5/2011 | Hack et al. | 438/462 |
| 2011/0136265 | A1 * | 6/2011 | Shigenobu et al. | 438/4 |
| 2013/0034294 | A1 * | 2/2013 | Heitzig et al. | 382/141 |

FOREIGN PATENT DOCUMENTS

| | | |
|---|---|---|
| DE | 10 2006 051 555 A1 | 5/2008 |
| DE | 10 2008 059763 A1 | 6/2010 |
| EP | 048 2240 A1 | 4/1992 |
| WO | WO 2008/056116 A1 | 5/2008 |
| WO | WO 2010/144778 A2 | 12/2010 |

* cited by examiner

*Primary Examiner* — Gregory M Desire
(74) *Attorney, Agent, or Firm* — Duane Morris LLP

(57) ABSTRACT

Method for the linear structuring of a coated substrate for producing thin-film solar cell modules in which tracks are introduced in an upper structure plane so as to be adapted to the path of existing tracks in a lower structure plane in that a structuring tool is controlled in y direction by means of a control quantity which is derived from image recordings of the existing tracks, and the substrate is moved back and forth under the structuring tool. The image recordings for acquiring existing tracks are carried out only during the forward passes. The generation of tracks takes place during the forward passes and backward passes.

2 Claims, 3 Drawing Sheets

METHOD FOR THE LINEAR STRUCTURING OF A COATED SUBSTRATE FOR THE PRODUCTION OF THIN-FILM SOLAR CELL MODULES

FIELD OF THE INVENTION

The invention is directed to a method for introducing line-shaped tracks into a substrate coated with thin layers for producing thin-film solar cell modules.

In so doing, the spacing of the patterning lines or structuring lines which form a transition area must be kept as small as possible in order to minimize the transition area which does not contribute to the generation of energy by the thin-film solar cell module.

BACKGROUND OF THE INVENTION

A generic method of the type mentioned above is known from WO 20120/144778 A2.

Thin-film solar cell modules comprise a rigid or flexible, plane substrate which serves as a carrier for thin layers arranged thereon. In order to produce thin-film solar cell modules, typically after application of a first layer to the surface of the substrate this first layer is ablated in a line-shaped manner at predetermined distances so as to form so-called p1 tracks with a depth equal to the thickness of the first layer (first structuring plane).

Subsequently, a second layer is applied to the surface so that the p1 tracks are filled in. So-called p2 tracks are produced parallel to and as close as possible to the p1 tracks, the second layer, but not the first layer, being ablated therein (second structuring plane).

After a third layer which fills in the p2 tracks is applied to the surface, so-called p3 tracks are produced close to the p2 tracks and p1 tracks, and the second layer and third layer, but not the first layer, are ablated therein (third structuring plane).

Together, the p1 tracks, p2 tracks and p3 tracks lying closest to one another form a transition area which separates the individual functional areas of the thin-film solar cell module, also known as structure units, from one another.

Different technologies which can be based on mechanical, chemical or thermal effects are known for generating the tracks. In so doing, the tracks should have the smallest possible distance from one another within a transition area without overlapping, much less crossing over one another.

Regardless of the technology for introducing the tracks, the substrate is thermally loaded at least when applying the layers, which can lead to permanent deformation of the substrate and, therefore, to deformation of tracks that have already been produced.

For this reason, a lower limit is set for the distance of the tracks from one another which ensures that the tracks of the different structuring planes do not overlap or intersect in spite of maximum possible deformation.

Therefore, in a typical orientation of track paths based on an outer edge of the thin-film solar cell modules, safety distances of approximately 100 to 200 μm are specified for the desired path of the tracks relative to one another. This means that the structuring tool, e.g., a scribing needle or a laser beam, is guided for the tracks within a transition area at distances parallel to the outer edge which differ from one another by approximately 100 to 200 μm depending on the track width. This results in a minimum width of greater than 200-400 μm for a transition area. In so doing, the tracks are introduced in a machining direction in alternating movement directions.

To provide a thin-film solar cell module with narrower transition areas and, therefore, improved efficiency, it is proposed in DE 10 2006 051 555 A1 that prior to or after the introduction of a new track the path of an already existing track is determined, and when introducing the new track the path of the new track is controlled relative to the path of the existing track.

Accordingly, a new track is generated whose track path corresponds to that of an adjacent track in the same transition area. In this way, the distance between the tracks can be reduced to a minimum, as is required for reasons pertaining to insulation.

The path of an existing track is advantageously determined optically; the optical detection can be carried out from the underside of the substrate and also from the coated upper side of the substrate prior to or also during the introduction of a new track.

In this case, track detection is carried out by a track position sensor which is made to follow the path of an existing track. The position of the track position sensor is used to control a reference point which follows the track position sensor at a defined distance and at which the structuring tool is directed onto the substrate. As an alternative to the track position sensor, it is also conceivable to photographically record a majority of the partially finished thin-film solar cell module and to use these photographs as a map to determine the reference point.

Track detection with a track position sensor as described in this instance has the drawback that this track position sensor must lead the reference point, i.e., the track can only be introduced in one movement direction of the machining direction, or two track position sensors must be provided and one track position sensor would have to be constantly repositioned.

Track detection of a majority of the partially finished thin-film solar cell module requires a camera with a receiver matrix having an extremely high pixel count in order to obtain a sufficient resolution for imaging an object field of corresponding magnitude, which makes the camera a very expensive measuring tool.

DE 10 2008 059 763 A1 discloses a method in which the tracks are produced in a current machining plane based on the path of an individual track of a previous machining plane, the path of this previous track is acquired by means of a sensor, and a correction value to be used for all tracks of a subsequent machining plane is formed therefrom. In this way, the deformation of a previous track relative to the ideal straight line is detected, but not the deviations of the previous tracks from one another.

EP 0 482 240 A1 also describes a method in which tracks are produced in a current machining plane based on the path of an existing track of a previous machining plane. For this purpose, the existing track is observed by a detection element and a correction signal is formed, by means of which a tool is controlled. In this case also, the tool must trail at least slightly behind the detection element in order to generate a track which is controlled by the detection signal and which is parallel to the existing track. Therefore, the detector must either be offset by the change in direction of track generation, or two detectors must be provided, or the machining must be carried out in only one directional orientation of the machining direction.

In a structuring method disclosed in WO 2008/056 116 A1, a sensor fastened to the structuring tool is likewise used to optically detect the path and position of an already existing track in a previous machining plane. The detection takes place ahead of the structuring at a machined track simultaneous with the structuring of the track in the current machining plane. The path and position of the detected track are stored intermediately and used during the next structuring process for orienting the next track to the already existing track. Accordingly, during the structuring a detection of the previous machining plane is also carried out continuously during every structuring process.

Also in WO 2010/144 778 A2 line-shaped tracks are generated in a thin-film solar cell module so as to be oriented to the path of already existing tracks. In so doing, the position of at least a first previously generated track is acquired by a camera in order to scribe a first machined track, and the position of the first machined track is also acquired by the camera subsequently in order to produce a second adjacent track near a second previously generated track depending on the position of the first machined track.

In a first scanning movement of the thin-film solar cell module, the path of at least one already existing track is acquired by the camera along the way in the machining direction so that another track which is oriented to the path of the at least one acquired track is produced during the next scanning movement. Optionally, in a second scanning movement backwards in machining direction, the path of at least one already existing track is likewise acquired by the camera so that another track which is oriented to the path of this at least one acquired track is produced during the next scanning movement. The new tracks are accordingly generated during a scanning movement in the same directional orientation as that in which the already existing tracks to which the new tracks relate were recorded. A peculiarity of the method described above consists in that during all subsequent scanning movements the track that has just been produced is always also acquired in order to determine distances between individual tracks, e.g., for calibration.

With regard to the arrangement of the tool, in this case a laser beam, in relation to the camera, two variants are indicated. On one hand, it is suggested to integrate the camera in a scanner and to direct the optical beam path and the laser beam to the workpiece by means of a shared beamsplitter. A solution of this kind seems to be possible only in theory, particularly that acquisition by means of a camera and generation of tracks by means of lasers can take place simultaneously. On the other hand, the camera is fastened to a common frame with a fixed offset relative to the scanner. Based on this offset, it can be concluded that, in practice, the same problem already described above with respect to machining in different directions occurs in this case.

SUMMARY OF THE INVENTION

It is an object of the invention to improve a method for structuring a thin-film solar cell module so as to be more time-efficient and economical.

The above-stated object is met for a method for the linear structuring of a coated substrate for producing thin-film solar cell modules in which tracks extending in x direction are introduced in a multi-layer, large-area substrate having a plurality of structure planes in that the substrate is moved back and forth horizontally in x direction in a plurality of passes between two end positions, and a structuring tool (8) which is displaceable into different positions above the substrate (1) in y direction between the passes acts on the substrate (1) during at least some of the passes so as to produce a track in an upper structuring plane, wherein it is controlled by a control signal so as to be deflected in y direction, and image recordings are generated for acquiring existing tracks of a lower structuring plane, control signals being derived therefrom in order to generate the tracks such that the path thereof is adapted to an existing track, wherein the image recordings for acquiring existing tracks are carried out only during forward passes and the generation of tracks takes place during the forward passes and backward passes.

In an advantageous manner, in each forward pass a pair of tracks of the lower structure plane with a nth track and with a n+1-th track is detected and in the upper structure plane a n−1th track is detected, and a nth track is generated in the subsequent backward pass.

BRIEF DESCRIPTION OF THE DRAWINGS

In the following, the present invention will be described more fully with reference to embodiment examples. The drawings show.

DESCRIPTION OF THE EMBODIMENTS

Figure 1:
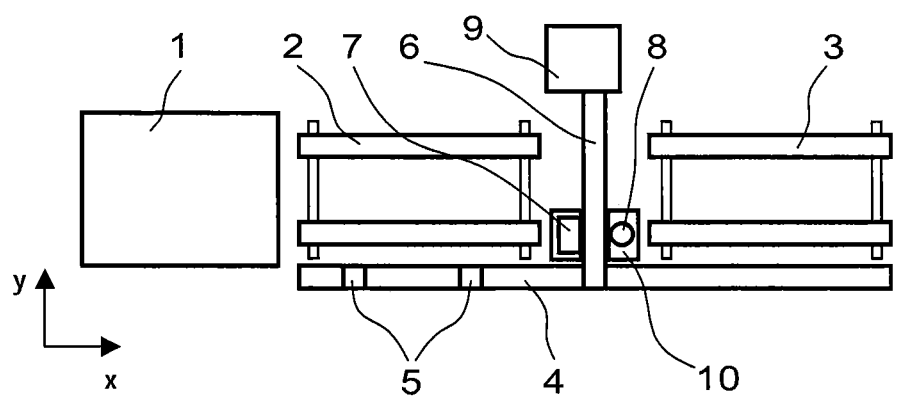
FIG. 1 a schematic diagram of an apparatus suitable for implementing the method.
Figure 2:
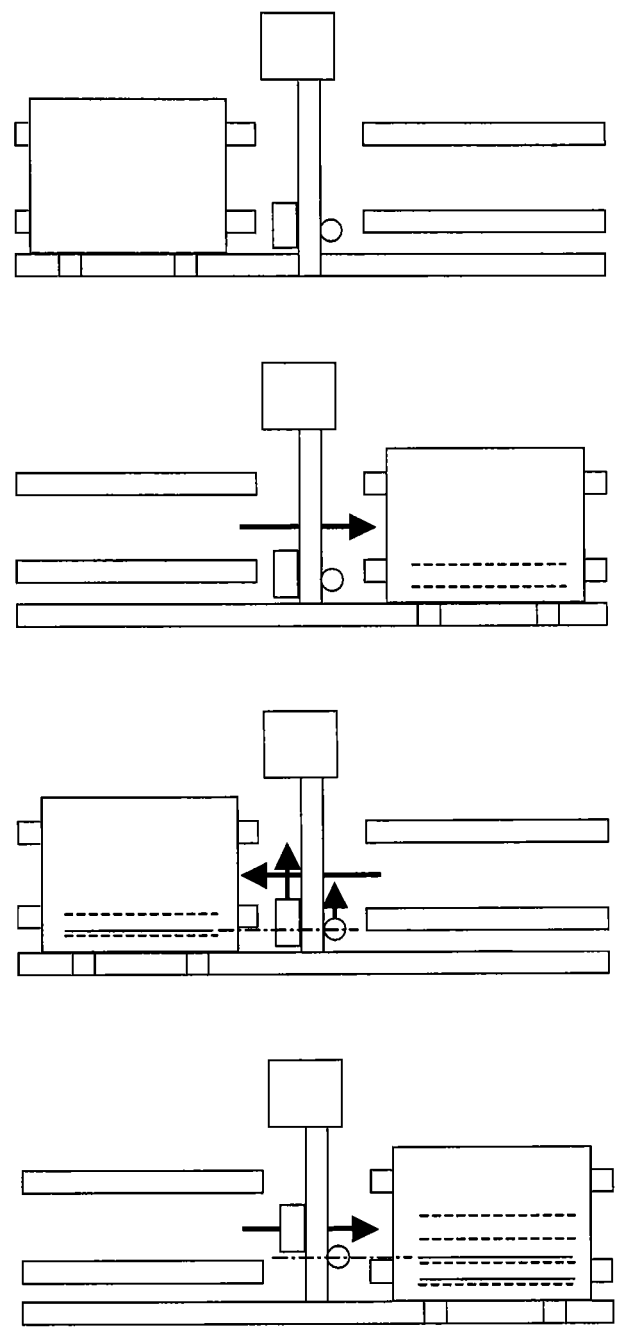
FIG. 2 the method steps of the method illustrated with reference to the change in position of a thin-film solar cell module within the apparatus shown in FIG. 1.

FIG. 1 is a schematic diagram showing an apparatus, as is known from the prior art, for implementing the method.

It comprises two conveyor belts 2, 3 which are arranged at the same height one behind the other, a transporting device 4 which transports in x direction and has grippers 5, a stationary portal 6 at which at least one machining head 10 having a camera 7 and a structuring tool 8 is arranged above the conveyor belts 2, 3 so as to be displaceable in y direction, and an evaluating and controlling unit 9. In principle, the machining head could also be arranged below the conveyor belt in a corresponding manner, but in technical respects the disadvantages would outweigh the advantages so that this possibility is not discussed further in the description of the method.

The devices mentioned above are arranged relative to one another in such a way that a workpiece, in this case a substrate 1, which is placed on one of the conveyor belts 2, 3 can be moved in x direction to the other conveyor belt 2, 3 by means of the transporting device 4 so as to be held by the grippers 5.

At the same time, a deposited substrate 1 can be optically detected by the camera 7 which is directed perpendicular to a supporting surface formed by the conveyor belts 2, 3 so that a stripe-shaped portion can be imaged along the entire length of the substrate 1 during a pass. The camera 7 is designed in such a way that its object field on the substrate 1 is wider than the provided distance between two adjacent tracks in a structuring plane (pair of tracks), so that the camera 7 can acquire two such tracks already existing in the substrate 1 while the substrate 1 is moved through once under the camera 7 (hereinafter referred to as a pass).

In order that the camera 7 can acquire pairs of tracks on the substrate 1, the camera 7 is arranged at the portal 6 so as to be displaceable in y direction, namely at predetermined positions which are dependent on the width of the substrate 1 and on the spacing between the tracks.

Also, the structuring tool 8 is arranged at the portal 6 at predetermined positions so as to be displaceable in y direction. At the respective position it can be deflected in y direction within a limited area during a pass so that the structuring tool 8 can describe a path which extends in x direction but which can deviate from a straight line within a limited area in y direction.

The evaluating and controlling unit 9 is connected to the camera 7 and to the structuring tool 8 and provides for a control of the structuring tool 8 depending on the geometrical deviations of already existing tracks which were previously acquired by the camera 7.

By means of the method, as was described above in the description of the prior art, either the tracks of the p2 structuring are generated by orientation to the existing tracks of the p1 structuring or the tracks of the p3 structuring are generated by orientation to the tracks of the p1 structuring or p2 structuring. By p1 structuring, p2 structuring and p3 structuring is meant in each instance structuring in a structuring plane; it is understood that the p3 structuring is above the p2 structuring and the p2 structuring is above the p1 structuring.

A first embodiment example for the method is described more fully in the following with reference to FIGS. 2a to 2d.

The substrate 1 was coated already in a prior process with a first layer, i.e., a contact layer, (e.g., with molybdenum), then provided with a p1 structure formed by tracks with a predetermined spacing and subsequently coated with a second layer, i.e., a photoelectric layer (e.g., $CuInS_2$). Additional tracks (p2 structure) oriented to the already existing tracks are introduced in this second layer. In so doing, the newly introduced tracks maintain a highly accurate parallelism and a spacing tolerance of $\pm 10$ μm relative to the p1 structure.

In order to produce the p2 structure, the substrate 1 is moved into the apparatus by means of the first conveyor belt 2 and is fixed in a first end position by the grippers 5 at the transporting device 4. The substrate 1 can be moved in x direction by the transporting device 4 between the first end position and a second end position, where it comes to rest on the second conveyor belt 3.

In order to distinguish between the two, the pass from the first end position to the second end position is referred to as the forward pass and the pass from the second end position into the first end position is referred to as the backward pass.

The substrate 1 is now moved through under the portal 6 in a first forward pass, wherein the camera 7 acquires a first pair of tracks with a first p1 track and a second p1 track. Each time that an image is recorded by the camera 7, correction values by which the individual tracks in the relevant track portion deviate from an ideal straight line can be determined from the image recording for the acquired track portion of the pair of tracks. When the relative position of the matrix receiver of the camera 7 with respect to the substrate 1 is known, the correction values of the acquired tracks can be matched to the positions of the substrate 1 at the time of the image recording. They are stored in the evaluating and controlling unit 9 so that they can be used for subsequent passes, during which tracks are generated in an overlying structuring plane, for forming track-oriented, position-dependent control quantities. In so doing, the correction values are associated with positions which are determined for every image recording by a predetermined spacing proceeding from an identical starting point.

During the subsequent first backward pass, the first p2 track is generated by the structuring tool 8. A laser beam which is focused on the substrate 1 by laser optics is preferably used as structuring tool 8. Instead of this, a mechanical scribing tool can also be used.

The structuring tool 8 is controlled by a control quantity so as to be deflected in y direction so that the track that is formed extends parallel to the first p2 track. In so doing, the control quantity which was derived from the first p1 track is used for control.

Prior to the second forward pass, the camera 7 is displaced in y direction into a position oriented to the third p1 track and fourth p1 track. The structuring tool 8 is likewise displaced in y direction and is oriented to the second p1 track. As in the first forward pass, a second pair of tracks, i.e., a third p1 track and fourth p1 track, is acquired and the image recordings are processed as was described above. At the same time, the second p2 track is produced. In so doing, the control quantity which was derived from the second p1 track is used for control.

Subsequently during the forward passes, as was mentioned above, a pair of tracks with a nth p1 track and n+1th p1 track is acquired and a n−1th p2 track is generated, and during the backward passes only a nth p2 track is generated until all tracks of the p2 structuring are finished.

A position-synchronous triggering of the camera 7, i.e., a triggering of the camera at identical distances from the first end position, is made simpler because the track detection always proceeds from the same end position.

Calculation of the control quantity, as location-dependent quantity, from the image recordings of existing tracks is also less cumbersome if it always proceeds from an identical starting point.

In an advantageous manner, the entire time period for the backward passes is available as computing time, since no recordings are made. Therefore, a plurality of image recordings can also be processed for every pass, as a result of which a more accurate control signal is formed. The apparatus can be used for machining substrates 1 of different lengths without laborious computational adjustments because the control quantity is always calculated with reference to the same starting point.

Figure 3:
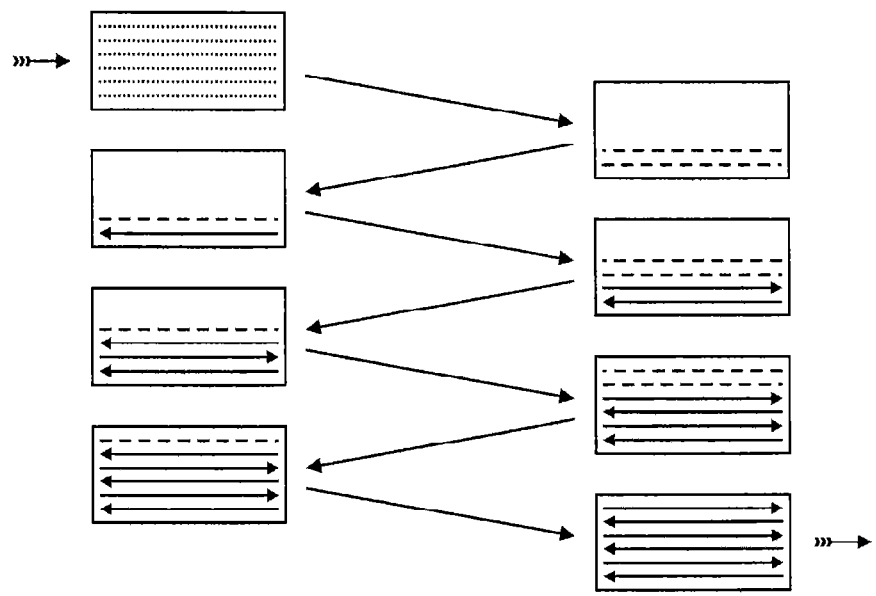
FIG. 3 the method steps of the method according to a first embodiment example based on the results of the individual method steps.

This method sequence can be illustrated once again in a simple manner referring to FIG. 3. In this case, the existing tracks are shown as dotted lines, the acquired tracks are shown as dashed lines, and the subsequently produced tracks are shown as solid lines. The arrows pointing toward the right-hand edge of the drawing represent the forward pass and the arrows pointing toward the left-hand edge of the drawing represent the backward pass.

The described method makes possible a comparatively more time-efficient so-called single-track mapping in which every subsequently produced track is generated so as to be oriented to a selected existing track.

Figure 4:
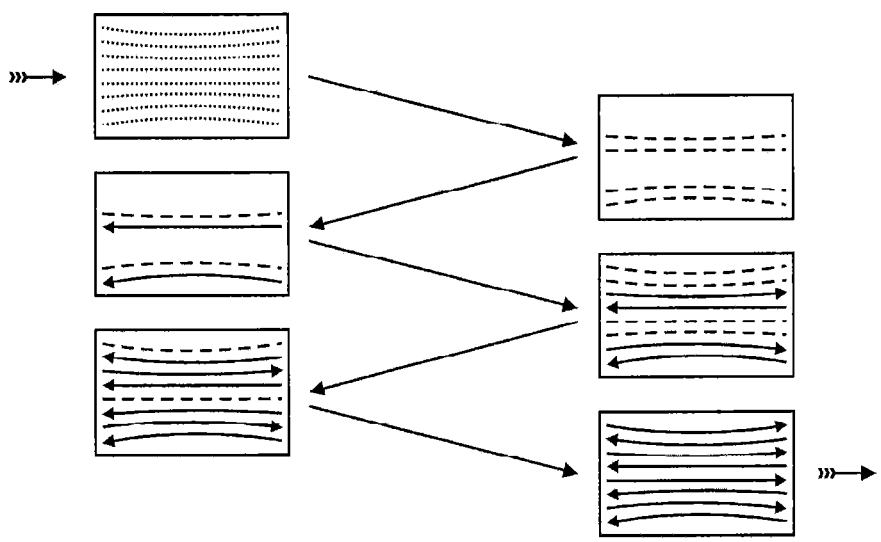
FIG. 4 the method steps of the method according to a second embodiment example based on the results of the individual method steps.

FIG. 4 shows an improved embodiment of the method in which a plurality of machining units comprising camera 7 and structuring tool 8 are put to use simultaneously for a faster structuring process at the portal 6. Each machining unit detects only one particular portion of the substrate 1. The machining of the portions is then carried out simultaneously analogous to the machining of the entire substrate 1 described with reference to the first embodiment example.

In a corresponding manner, during a forward pass a pair of tracks with a nth track and n+1th track and a pair of tracks with a mth track and m+1th track are acquired and, provided this is not the first forward pass, a n−1th track and m−1th track are generated. During the backward passes, no track pairs are acquired; rather, only a nth track and a mth track are generated. The spacing between the nth track and mth track corresponds to the width of the portions.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

REFERENCE NUMERALS 1 substrate
2 first conveyor belt
3 second conveyor belt
4 transporting device
5 gripper
6 portal
7 camera
8 structuring tool
9 evaluating and controlling unit
10 machining head

The invention claimed is:

1. Method for the linear structuring of a coated substrate for producing thin-film solar cell modules comprising introducing tracks extending in an x direction in a multi-layer, large-area substrate having at least one lower structure plane, wherein the substrate is moved back and forth horizontally in the x direction in a plurality of passes between two end positions, and wherein a structuring tool which is displaceable into different positions above the substrate in a y direction between the passes generates a track in an upper structuring plane during the passes, wherein it is controlled by a control signal so as to be deflected in the y direction, and generating image recordings for acquiring existing tracks of the lower structuring plane, wherein control signals are derived from the image recordings in order to generate the tracks in said upper structure plane such that the path thereof is adapted to an existing track in said lower structure plane, wherein the image recordings for acquiring existing tracks in said lower structure plane are carried out only during the forward passes and the generation of tracks in said upper structure plane takes place during the forward passes and backward passes.

2. Method according to claim 1, wherein in each forward pass a pair of tracks of the lower structure plane with a nth track and with a n+1-th track is detected and in the upper structure plane a n−1th track is detected, and a nth track is generated in the subsequent backward pass.

* * * * *